United States Patent

Facon et al.

Patent Number: 4,484,112
Date of Patent: Nov. 20, 1984

[54] PROTECTION DEVICE FOR THE HORIZONTAL SCANNING CONTROL OF A DISPLAY SCREEN

[75] Inventors: Michel Facon; Robert Julien, both of Colombes, France

[73] Assignee: Thomson CSF Telephone, Colombes, France

[21] Appl. No.: 477,731

[22] Filed: Mar. 22, 1983

[30] Foreign Application Priority Data

Mar. 26, 1982 [FR] France .................. 82 05243

[51] Int. Cl.$^3$ .................. H01J 29/70; H01J 29/76
[52] U.S. Cl. .................. 315/399; 358/190
[58] Field of Search .................. 315/399, 408, 411; 358/190, 243

[56] References Cited

FOREIGN PATENT DOCUMENTS 2007453  5/1979  United Kingdom .

*Primary Examiner*—Theodore M. Blum
*Attorney, Agent, or Firm*—Roland Plottel

[57] ABSTRACT

The invention relates to a display screen horizontal scanning control protection device. The device comprises a switch making it possible to open or close the supply circuit of the scanning control circuit, said switch being activated with the aid of a signal supplied by an AND gate, whose state is a function of the level of the supply voltage of the central unit, which itself generates the horizontal scanning sync signal activating the scanning control circuit.

Application to telematic terminals equipped with a cathode-ray tube screen.

7 Claims, 5 Drawing Figures

PROTECTION DEVICE FOR THE HORIZONTAL SCANNING CONTROL OF A DISPLAY SCREEN

BACKGROUND OF THE INVENTION

The present invention relates to a protection device for a horizontal scanning control of a display screen and particularly a device for a cathode-ray screen for use in a terminal, which generates all the sync signals necessary for the display of a picture or image on the screen. Thus, the sync signals are generated as soon as the terminal is made live.

In the case of this type of screen, the horizontal scanning control is supplied by means of a transistor, which receives the sync signal at its base. However, when turning on or off, the sync signal is not stable and consequently the scanning control transistor requires protection, because it can be subject to high voltage or current variations, which may lead to the deterioration thereof. This draw back is usually prevented by the use of an integrated oscillating circuit, whose inherent oscillating frequency is roughly equal to the line frequency. Thus, this circuit makes it possible to continuously have a very stable scanning sync signal, so that there is no need for the transistor to have a special protection. The main disadvantage of this method is the high cost of this type of oscillator and the auxiliary circuits which it requires.

SUMMARY OF THE INVENTION

The present invention therefore proposes a relatively small and of low cost protective device making it possible to protect the transistor, which receives the sync signal emitted by the central unit of the terminal and which controls the horizontal scanning, so that there is no need to use a local oscillator.

The present invention therefore relates to a protection device for the horizontal scanning control of a display screen, said control making it possible to activate a horizontal scanning circuit on receiving a sync signal, comprising a threshold detector receiving a first signal supplied by the central unit and delivering a second signal which is a function of the level of said first signal; an AND gate receiving on a first input a third signal supplied by the central unit, receiving on a second input said second signal and supplying a fourth signal; a shaping circuit receiving a fifth signal generated by the central unit, reshaping it and transmitting a reshaped signal to the scanning control; and a switch receiving the fourth signal which, according to of its state, makes it possible to control the opening or closing of the switch and thereby making it possible to energise or not energise the horizontal scanning circuit.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
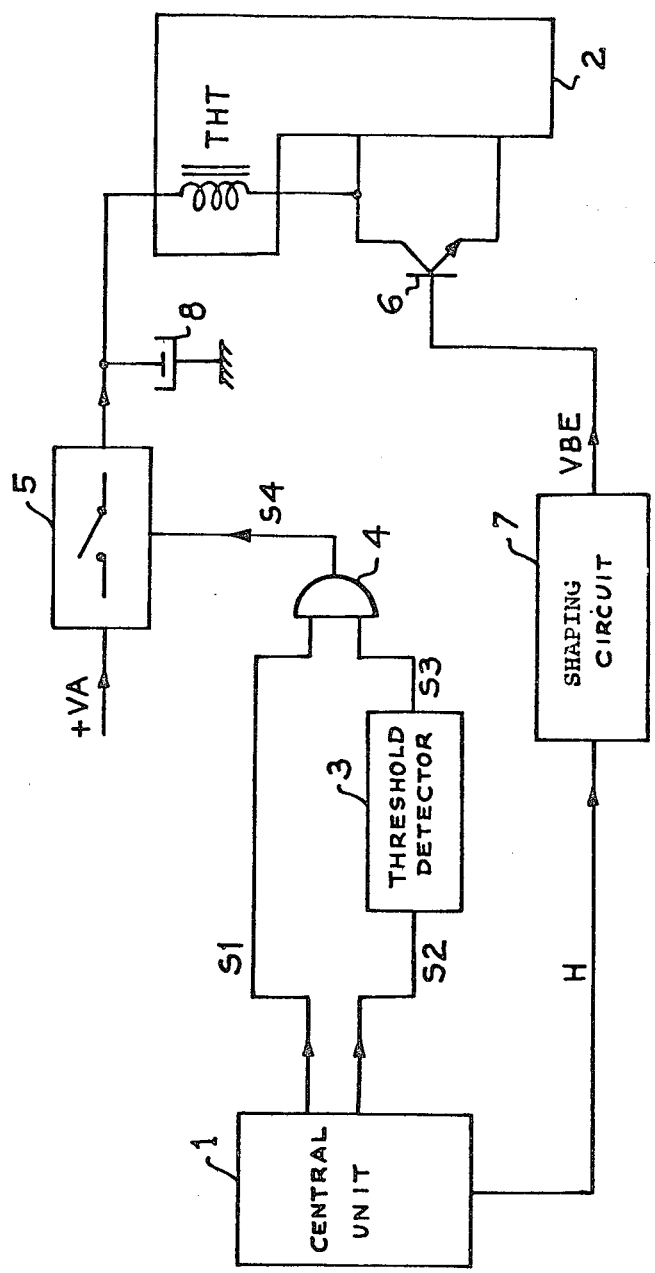
FIG. 1 a general diagram of a scanning control protection device according to the invention.

The protection device of the horizontal scanning control of a display screen is diagrammatically illustrated in FIG. 1. The device receives a sync signal H from a device called a central unit 1, as soon as the initialization phase has been performed. This central unit is the intelligent device of the terminal in which is placed the protection device The initialization phase consists of transmitting external instructions (which are typed on a keyboard connected e.g. to the terminal) for controlling a number of sequences. These sequences consist of generating the sync signal H and generating a signal for controlling the supply or energisation of scanning circuit 2.

As soon as the terminal is turned on and on receiving the external instruction, central unit 1 generates sync signal H and a signal S1 for controlling the supply of scanning circuit 2.

A threshold detector 3 receives a signal S2 representing the supply voltage level of central unit 1. It performs a comparison between the voltage level given by this signal S2 and a predetermined threshold.

If the detected voltage level is equal to or higher than the predetermined threshold, this means that the supply voltage is correct. Detector 3 then supplies a signal S3. If the detected voltage level is below the predetermined threshold, this means that the central unit 1 is not correctly supplied or energized. Detector 3 then supplies a signal $\overline{S3}$, which is the inverse of signal S3.

An AND gate 4 receives signals S1 and S3, or S1 and $\overline{S3}$ and respectively supplies signals S4 or $\overline{S4}$, the latter being the inverse of signal S4.

A switch 5 is controlled by the output signal of AND gate 4. When this switch 5 receives signal S4, it closes, allowing the supply of the circuits located downstream which control the horizontal scanning of the screen. When switch 5 receives signal $\overline{S4}$, it opens, what prevents said circuits from being supplied On turning the terminal on, voltage S2 exceeds the value of the predetermined threshold. Signal S3 is at logic state 1 (for example). Following the initialization phase, the central unit has generated signals H and S1. Signal S1 is also in logic state 1 to enable gate 4 to supply a signal S4 controlling the opening of switch 5.

On turning the terminal off, supply voltage S2 drops. Threshold detector 3 delivers signal $\overline{S3}$, which corresponds to logic state 0. Gate 4 delivers a signal $\overline{S4}$ controlling the opening of switch 5.

The scanning circuit 2 receives sync signal H via a control circuit 6, as soon as the terminal has received the corresponding external instruction, but it is only supplied when switch 5 is closed. The control circuit comprises a NPN transistor 6, connected as a common emitter, which receives at its base via a shaping circuit 7, sync signal H. Thus, transistor 6 is only supplied, when switch 5 is closed, i.e. when the central unit supply voltage is correct and consequently the sync signal H is perfectly stabilized.

When the terminal is turned off, the supply voltages are switched off, switch 5 opens, but transistor 6 remains energised by capacitor 8, which has charged during operation. The generated collector current Ic does not exceed a maximum value Icmax, which represents the satisfactory operating limit of the transistor, because the energy involved is low (equal to $\frac{1}{2} C8 (VA)^2$, C8 being the capacitance of capacitor 8).

The sync signal H generated by the central unit 1 is received by a shaping circuit 7, which makes it possible to take into account the line scanning pulses, whose duration is predetermined. Circuit 7 also makes it possible to reshape this signal, so that it is taken into account by transistors 6 at the significant times.

Figure 2:
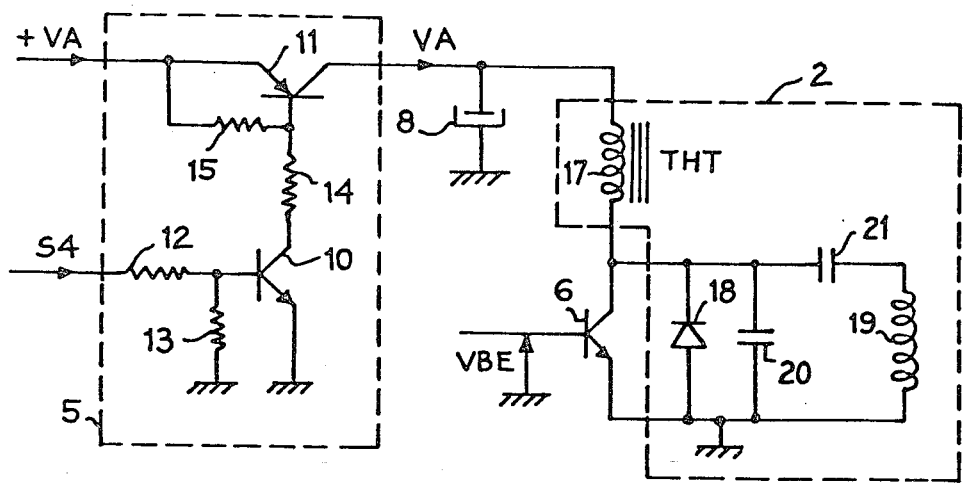
FIG. 2 a detailed diagram of a particular construction of the switch and scanning circuit.

A particular construction of switch 5 and the horizontal scanning circuit is given in FIG. 2. Switch 5 comprises two transistors 10 and 11.

Transistor 10 receives the output voltage from gate 4 (signal S4) via a divider bridge 12 and 13. Transistor 10 is a npn transistor connected in common emitter configuration, whose collector is connected to the base of transistor 11 via a resistor 14 and whose emitter is connected to earth. Transistor 11 is a npn transistor connected as a common emitter. The emitter of this transistor receives the supply voltage +VA, which is used for supplying scanning circuit 2 and said emitter is also connected to the base of transistor 11 via a resistor 15. The transistor collector is connected to electrolytic capacitor 8.

When the voltage applied to the base of transistor 10 is positive, the base-emitter junction of this transistor is forward biased, the transistor 10 being conductive. The base-emitter junction of transistor 11 is then forward biased and the transistor is conductive. The collector voltage of transistor 11 is substantially equal to the supply voltage +VA, switch 5 is closed and scanning circuit 2 energized.

When the voltage applied to the base of transistor 10 is 0, the base-emitter junction of this transistor 10 is reverse biased, the transistor is blocked or off, whilst its collector current is zero. The voltage applied to the base of transistor 11 is then equal to +VA. The voltage applied to the base-emitter junction is zero. The transistor 11 is off. Switch 5 is opened and scanning circuit 2 is not energized.

The scanning circuit 2 comprises an extra high voltage (THT) transformer 17 supplied via capacitor 8, the collector of the control transistor being charged by said transformer. A diode 18 connected in parallel between the collector and emitter of the transistor 6 cancels out the negative pulse caused by the presence of an oscillating circuit LC, conventionally called a horizontal deflector.

Circuit LC comprises a capacitor 20 in parallel with diode 18, as well as a capacitor 21 in series with a coil 19, connected in parallel with capacitor 20. Coil 19 supplies a sawtooth current and leads to the horizontal deflection of the spot on the screen.

Figure 3:
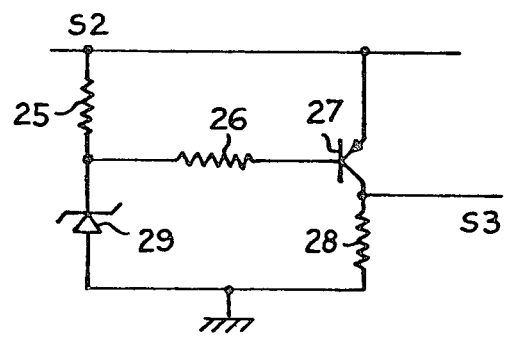
FIG. 3 a diagram of a special construction of a threshold detector.

FIG. 3 illustrates a special construction of threshold detector 3. This circuit comprises a pnp transistor 27 connected as a common emitter, the emitter being supplied by a signal S2, i.e. by the supply voltage of central unit 1. The collector of transistor 27 supplies signal S3 and is connected to earth via a resistor 28. The base is connected to the cathode of a Zener diode 29 via a resistor 26. The anode of diode 29 is connected to earth and the cathode is connected to signal S2 by a resistor 25.

The base voltage of transistor 27 is substantially equal to the Zener voltage, whilst voltage S2 is below the predetermined threshold, the base-emitter junction is reverse biased, the transistor is off and the output S3 is zero. When the voltage S2 exceeds the threshold, the base-emitter junction is forward biased, transistor 27 is saturated, output S3 is substantially equal to S2, whilst S3 is in logic state 1.

Figure 4:
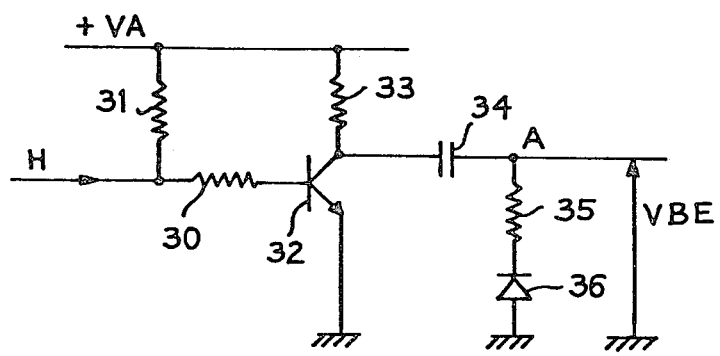
FIG. 4 a diagram of a special construction of the shaping circuit.

FIG. 4 illustrates a particular construction of the shaping circuit 7. The latter comprises a npn transistor connected in common emitter configuration. The base receives signal H via a resistor 30, which is connected to power supply +VA by a resistor 31. The collector of transistor 32 is connected to supply +VA by a resistor 33.

The emitter of the transistor is connected to earth. A resistor 35 in series with a diode 36 is connected between the collector of transistor 32 and earth. The cathode of diode 36 is connected to resistor 35, whilst the anode is connected to earth. A connecting capacitor 34 connects the collector of transistor 32 to resistor 35.

Transistor 32 is conductive, when signal H has a positive pulse of given length, the output voltage VBE between terminal A and earth being negative. When signal H is zero, transistor 32 is blocked and the output voltage VBE is positive.

Figure 5:
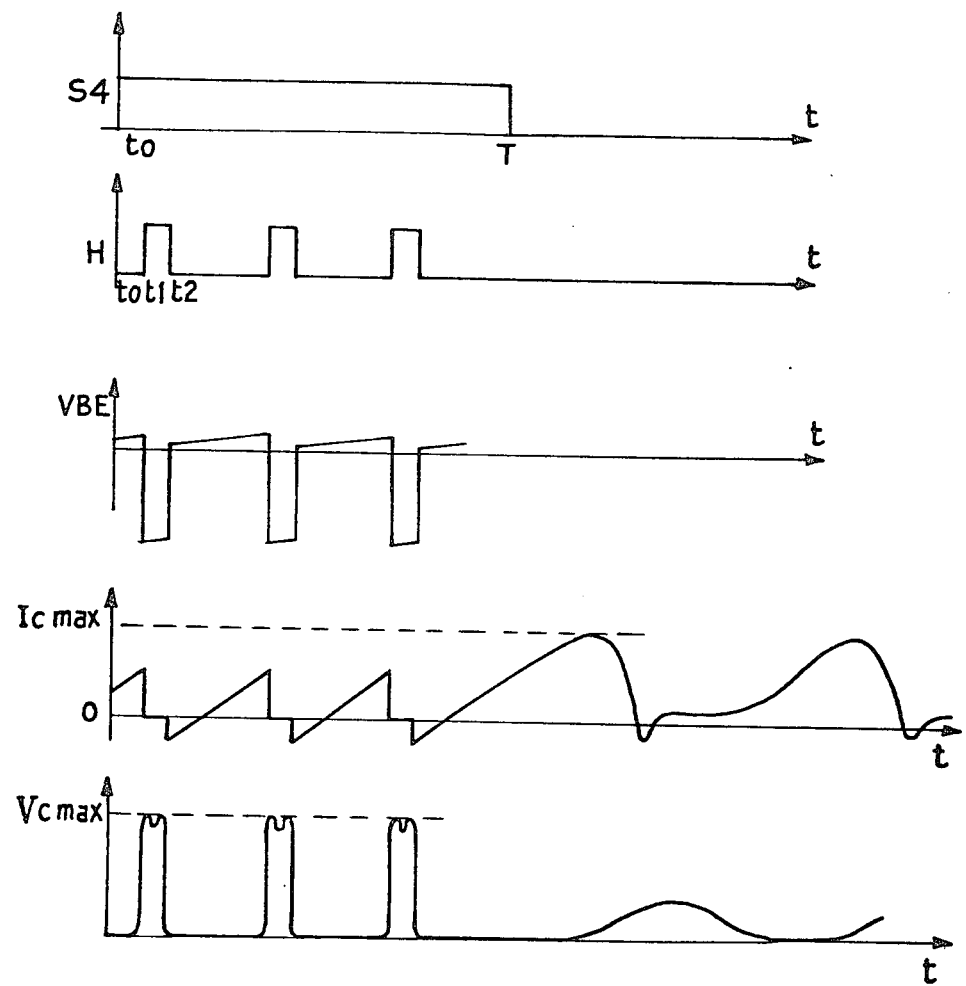
FIG. 5 a time diagram.

FIG. 5 illustrates a time diagram for signals S4 and H, the voltage of the base-emitter junction of the scanning control transistor 6, the collector current Ic of said transistor and the collector voltage of transistor 6.

The time interval T-to corresponds to a satisfactory operation of central unit 1, its supply voltage being correct (stable), so that it generates a periodic sync signal H, whose pulse level is clearly defined.

The output signal S4 of gate 4 is at logic level 1 for the same time interval and this corresponds to the closing of switch 5 and consequently to the energizing of scanning circuit 2. Voltage VBE is negative during clock pulses H and positive when signal H is zero. Transistor 6 conducts when voltage VBE is positive, i.e. when signal H is zero. During the time interval T-to, current Ic and voltage Vc develop normally. Beyond time T, the supply to the central unit stops.

Signal S4 is at logic state zero, which corresponds to the opening of switch 5. The scanning circuit is not supplied by the supply voltage +VA. As in this particular case it consists of the suppression o fthe power supply following a correct operation, the scanning circuit 2 and the shaping circuit 7 are supplied by capacitor 8 for a time determined by its discharge time constant.

The path of the sync signal H is no longer known. If signal H is zero immediately after the interruption of the power supply, transistor 6 is conductive. The collector current Ic does not exceed the limit value Icmax for which the transistor is still in its safety area, because the energy involved is low (equal to $\frac{1}{2} C8 (VA)^2$).

If signal H has a cycle longer than that corresponding to satisfactory operation, the collector voltage Vc is limited to a maximum limit value Vcmax.

In the case shown in FIG. 2, the various components have the following respective values:

+VA: +30 V
12: 2.7KΩ
13: 1KΩ
14: 4.7KΩ
15: 1KΩ
8: 10 µF
19: 470 µH

Transistor 6 is a npn transistor of type BU806 or the equivalent. Transistor 10 is a npn transistor of type MPSA42 or equivalent.

Transistor 11 is a pnp transistor of type BD 710 or the equivalent.

25: 56Ω
26: 1KΩ
28: 680Ω

Transistor 27 is a pnp transistor of the type 2N2907A or equivalent. Diode 29 is a 3.9 V Zener diode:

30: 3.9KΩ
31: 1KΩ
33: 1KΩ
34: 0.68 μF
35: 100Ω

Transistor 32 is a npn transistor of the type BC372 or equivalent. Diode 36 is of type 1N4148 or equivalent.

What is claimed is:

1. A protection device for the horizontal scanning control of a display screen comprising a horizontal scanning circuit incorporating an extra high voltage transformer, said control making it possible to activate the horizontal scanning circuit on receiving the sync signal, wherein the device comprises a central unit for supplying a first, a second and a third signal; a threshold detector receiving the second signal supplied by the central unit and delivering a fourth signal which is a function of the level of the second signal; an AND gate receiving on a first input the first signal supplied by the central unit, receiving on a second input the fourth signal and delivering a fifth signal; a shaping circuit receiving the third signal generated by the central unit, for reshaping it and transmitting a reshaped signal to the scanning control; and a switch receiving the fifth signal which, as a function of its state, making it possible to control the opening or closing of the switch and thus making it possible to supply or not supply the horizontal scanning circuit.

2. A protection device according to claim 1, wherein the switch comprises a first npn transistor connected in common emitter configuration, for receiving the fifth signal on its base, the state of this signal making it possible to block the transistor or make it conductive and a second pnp transistor connected in common-emitter configuration, for receiving on its base the collector current of the first transistor and for receiving on its emitter a given supply voltage and for delivering or not delivering said voltage to the scanning circuit as a function of the state of the first transistor.

3. A protection device according to claim 2, wherein the switch comprises a first divider bridge connected to the base of the first transistor, making it possible to regulate the operating point of this transistor and a second divider bridge connected to the base of the second transistor making it possible to regulate the operating point of this transistor.

4. A protection device according to claim 1, wherein the scanning control circuit comprises a npn transistor connected in common-emitter configuration, whose collector receives the predetermined supply voltage via the primary of the extra high voltage transformer and whose base receives the signal supplied by the shaping circuit.

5. A protection device according to claim 1, wherein the threshold detector comprises a pnp transistor connected in common-emitter configuration, which receives on its emitter the second signal and which supplies on its collector the third signal and a Zener diode, whose Zener voltage is substantially equal to a predetermined threshold, the transistor being conductive when the base voltage exceeds this predetermined threshold and whereby it then supplies a voltage corresponding to logic state 1 for the AND gate.

6. A protection device according to claim 1, wherein the shaping circuit comprises a npn transistor connected in common-emitter configuration, whose emitter is connected to earth and whose base receives the third signal, which is a sync signal, said transistor being supplied by the supply voltage of the scanning circuit and supplying the reshaped signal which is a function of the state of the sync signal, said signal being negative when the third signal is positive and positive when the sync signal is zero.

7. A protection device according to claim 6, wherein the shaping circuit also comprises a resistor in series with a diode, the cathode of said diode being connected to the resistor and the anode being connected to earth, a connecting capacitor making it possible to connect the resistor to the transistor collector, the said diode and said resistor making it possible to obtain a faster state of change of the reshaped signal applied to the base of the scanning control transistor and consequently a greater blocking of said transistor.

* * * * *